US006535611B1

(12) United States Patent
Lau

(10) Patent No.: US 6,535,611 B1
(45) Date of Patent: Mar. 18, 2003

(54) METHOD AND APPARATUS FOR REDUCING SWITCHING NOISE OF A DIGITAL VOLUME CONTROL

(75) Inventor: Jimmy Lau, Santa Clara, CA (US)

(73) Assignee: Oak Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/232,776

(22) Filed: Jan. 15, 1999

(51) Int. Cl.[7] ................................................ H03G 3/00
(52) U.S. Cl. ........................ 381/104; 381/107; 381/109
(58) Field of Search ................................ 381/104, 107, 381/109, 119, 94.1, 94.5; 700/94; 804/633

(56) References Cited

U.S. PATENT DOCUMENTS 4,390,834 A * 6/1983 Ohshita ...................... 381/104
5,289,546 A * 2/1994 Hetherington .............. 381/104
5,394,476 A * 2/1995 Rollins et al. .............. 381/109
5,745,057 A * 4/1998 Sasaki et al. ............... 381/109
5,796,852 A * 8/1998 Yamaguchi ................. 381/104
5,802,187 A * 9/1998 Hsu ........................... 381/119
6,088,461 A * 7/2000 Lin et al. .................... 381/104
6,094,490 A * 7/2000 Kim .......................... 381/94.5

* cited by examiner

*Primary Examiner*—Xu Mei
(74) *Attorney, Agent, or Firm*—William L. Paradice, III

(57) ABSTRACT

An audio interface is coupled to received a music signal and a microphone signal. The music signal and a volume control signal are combined in a multiplier to produce a volume adjusted music signal. In response to an input signal from a user, the volume control signal is gradually changed in predetermined increment levels. Thus, the multiplier gradually changes the audible volume in these predetermined increment levels. The resulting music and microphone signal are stored in corresponding partitions of a single memory, and thereafter provided to a mixing circuit. The mixing circuit combines signal samples read from the memory to produce four output signals each containing first and second channel samples. The resultant 8 channel samples are gated in a formatter with respective channel mute signals which, when asserted, effectively mute their corresponding channel sample.

9 Claims, 10 Drawing Sheets

FIG. 6A

```
///////////////////////////////////////////////////////
/// current_vol updates at signal current_vol_update ///
///////////////////////////////////////////////////////

///////////////////////////////////////////////////
/////////////////volume calculation////////////////
///////////////////////////////////////////////////
reg [10:0] vol_diff,vol_diff_n ;
reg [1:0] vol_cntrl_state,vol_cntrl_state_n ;
always@(posedge sysclk or negedge sysreset_)
        begin
        if(-sysreset_)
                begin
                vol_cntrl_state[1:0] <= 2'b0 ;
                current_vol[9:0] <= 10'd512 ;
                end
        else
                begin
                vol_cntrl_state[1:0] <= vol_cntrl_state_n[1:0] ;
                current_vol[9:0] <= current_vol_n[9:0] ;
                end
        end

always@(posedge sysclk)
        begin
        vol_diff[10:0] <= vol_diff_n[10:0] ;
        end

reg [2:0] vol_delta_n ;
always@(vol_cntrl_state or fading_vol_step or vol_diff or target_vol or current_vol
                 or vol_delta_n or path_cntr or current_vol_update or fading_vol_step)
        begin
        ///////////////////////////////////////////////////////////////////////
        ///////////////////////////////////////////////////////////////////////
        case(fading_vol_vol_step[1:0])
        2'd0
                begin
                vol_delta_n[2:0] = 3'd0 ;
                end
        2'd1
                begin
                vol_delta_n[2:0] = 3'd1 ;
                end
        2'd2
                begin
                vol_delta_n[2:0] = 3'd2 ;
                end
        2'd3
                begin
                vol_delta_n[2:0] = 3'd4 ;
                end
        endcase
```

```
////////////////////////////////////////////////////////////////////////
////////////////////////////////////////////////////////////////////////
vol_cntrl_state_n[1:0] = vol_cntrl_state[1:0] ;
vol_diff_n[10:0] = vol_diff[10:0] ;
current_vol_n[9:0] = current_vol[9:0] ;

case(vol_cntrl_state_n[1:0]
2'd0:
        begin
        if(fading_vol_step[1:0]==2'd0)
                begin
                //vol_step is 0, stays here and update to target //
                //vol whenever update signal is issued//
                current_vol_n[9:0] = current_vol_update ? target_vol[9:0] ;
                                                         current_vol[9:0] ;
                vol_cntrl_state_n = 2'd0 ;
                vol_diff_n[10:0] = 11'b0 ;
                end
        else //for step != 0 //
                begin
                if(path_cntr[2:0]==3'd1)
                        //starting from path_cntr turning into 1//
                        begin
                        current_vol_n[9:0] = current_vol[9:0] ;
                        vol_diff_n[10:0] = target_vol[9:0] - current_vol[9:0] ;
                        vol_cntrl_state_n = 2'd1 ;
                        end
                else //for finished updating and not yet starting//
                        begin
                        //idling//
                        vol_diff_n[10:0] = 11'b0 ;
                        vol_cntrl_state_n = 2'd0 ;
                        current_vol_n[9:0] = current_vol[9:0] ;
                        end
                end
        end
2'd1:
        begin
        if(vol_diff[10]) //for -ve diff//
                begin
                vol_diff_n[10:0] = -vol_diff[10:0] + 1'b1 ;
                vol_cntrl_state_n = 2'd3 ;
                current_vol_n[9:0] = current_vol[9:0] ;
                end
        else //for +ve diff or 0 diff//
                begin
                vol_diff_n[10:0] = vol_diff[10:0] ;
                //back to state d0 if diff is exactly 0//
                vol_cntrl_state_n = (|vol_diff[9:0]) ? 2d'2 : 2'd0 ;
                current_vol_n[9:0] = current_vol[9:0] ;
                end
        end
```

FIG. 6B

```
2'd2: //for +ve diff//
        begin
        vol_diff_n[10:0] = vol_diff[10:0] ;
        if(current_vol_update)
                begin
                vol_cntrl_state_n[1:0] = 2'd0 ;
                //max_vol checking//
                if((|vol_diff[10:3])|(vol_diff[2]&(vol_diff[1]|vol_diff[0])))
                //vol_diff is (8 or up) or (5-7) //
                        begin
                        current_vol_n[9:0] = current_vol[9:0] + vol_delta_n[2:0] ;
                        end
                else
                        begin
                        //////enters here only if diff is 1,2,3,4/////
                        case(fading_vol_step[1:0])
                        2'd0:
                                begin
                                //should never get down here//
                                end
                        2'd1
                                begin
                                //should not worry about diff=0 which //
```

FIG. 6C

```
                    //has already been taken care of//
                    current_vol_n[9:0] = current_vol[9:0] + 2'd1 ;
                    end
                2'd2
                    begin
                    if(vol_diff(2)|vol_diff(1) //if diff is 2 or 3 or 4//
                        current_vol_n[9:0] = current_vol[9:0] + 2'd2 ;
                    else //for diffis 1//
                        current_vol_n[9:0] = target_vol[9:0] ;
                    end
                2'd3:
                    begin
                    current_vol_n[9:0] = target_vol[9:0] ;
                    end
                endcase
                end
            end
        else
            begin
            //stays here and wait for the update signal//
            vol_cntrl_state_n[1:0] = 2'd2 ;
            current_vol_n[9:0] = current_vol[9:0] ;
            end
        end
    2'd3: //for -ve diff//
        begin
        vol_diff_n[10:0] = vol_diff[10:0] ;
        if(current_vol_update)
            begin
            vol_cntrl_state_n[1:0] = 2'd0 ;

            if( (|vol_diff[10:3]) | (vol_diff[2]&(vol_diff[1]|vol_diff[0])) )
            //vol_diff is(8 or up) or (5-7)//
                begin
                current_vol_n[9:0] = current_vol[9:0] - vol_delta_n[2:0] ;
                end
            else
                begin
                case(fading_vol_step[1:0])
                2'd0:
                    begin
                    //should never be here, already been //
                    //taken care of in state0//
                    end
                2'd1:
                    begin
                    //should not worry about diff=0 which has //
                    //already been taken care of//
                    current_vol_n[9:0] = current_vol[9:0] - 2'd1 ;
                    end
```

FIG. 6D

```
                    2'd2:
                        begin
                        if(vol_diff[2]|vol_diff[1]) //if diff is 2 or 3 or 4//
                            current_vol_n[9:0] = current_vol[9:0] - 2'd2 ;
                        else
                            current_vol_n[9:0] = target_vol[9:0] ;
                        end
                    2'd3:
                        begin
                        current_vol_n[9:0] = target_vol[9:0] ;
                        end
                    endcase
                    end
                end
            else
                begin
                //stays here and wait for update signal//
                vol_cntrl_state_n[1:0] = 2'd3 ;
                current_vol_n[9:0] = current_vol[9:0] ;
                end
            end
////////////////////////////////////////////////////////////////////////////////
////////////////////////////////////////////////////////////////////////////////
        endcase
        end
```

FIG. 6E

FIG. 6

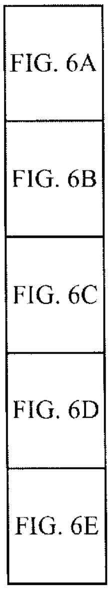

METHOD AND APPARATUS FOR REDUCING SWITCHING NOISE OF A DIGITAL VOLUME CONTROL

CROSS-REFERENCES TO RELATED APPLICATIONS

This application is related to commonly owned applications Ser. No. 09/232,767 entitled "Method and Apparatus for Audio Signal Channel Muting" and Ser. No. 09/232,776 entitled "A Method And Apparatus For Reducing Switching Noise of a Digital Volume Control," both filed on the same day as this application.

BACKGROUND

1. Field of Invention

This invention relates generally to digital signal processing and specifically to controlling the volume of a DVD player.

2. Description of Related Art

FIG. 1 shows a conventional digital sound system 1 configured in accordance with the MPEG2 standard, where the left and right channels of an incoming music signal S are coupled into a receiving circuit 10. The resultant left and right channel samples are combined in a well known manner and provided as a stereo signal to a first input terminal of a multiplier 12. A volume signal VOL provided by a volume control knob (not shown) is coupled to a second input terminal of the multiplier 12. The multiplier 12 multiplies the input stereo signal and the input volume signal to produce a volume adjusted, output stereo signal. Here, volume control of the stereo signal is realized by shifting bits of the stereo signal in response to the volume signal. The volume adjusted stereo signal is provided to a memory 14 for buffering, and thereafter converted to an analog stereo signal using a digital-to-analog converter (DAC) 16. The resultant analog stereo signal is coupled to a first input terminal of an analog mixing circuit 18. The mixer 18 includes a second input terminal coupled to receive an analog microphone input signal MIC provided by an associated microphone (not shown). In response to a control signal C received at its control terminal, the mixer 18 provides to a loudspeaker 20 either the analog stereo signal or the analog microphone signal superimposed onto the analog stereo signal.

Although the volume control technique mentioned above is relatively simple to implement, instantaneously changing the volume of a stereo signal in such a manner often results in an audible "popping" noise. If the volume is set to a sufficiently high level, this popping noise may blow the attached speakers. One solution offered to eliminate the popping noise is to mute the output stereo signal during volume transitions. However, the resultant silence introduced into the output signal during volume transitions is unacceptable to some listeners. Further, conventional channel muting techniques such as, for instance, disabling the DAC or zeroing the stereo samples while buffered in memory, requires complex logic circuitry which, in turn, undesirably introduces additional timing considerations and consumes valuable silicon area. Thus, there is a need for an improved audio signal interface which alleviates the above-de,scribed problems.

SUMMARY

An audio interface is disclosed which eliminates popping noise during volume transitions and implements a channel muting function while saving silicon area. In accordance with the present invention, an audio interface is coupled to receive a music signal and a microphone signal. The music signal and a volume control signal are combined in a multiplier to produce a volume adjusted music signal. In response to an input signal from a user, the volume control signal is gradually changed in predetermined increment levels. The resulting music and microphone signal samples are stored in corresponding partitions of a single memory, and thereafter provided to a mixing circuit. The mixing circuit combines signal samples read from the memory to produce four output signals each containing first and second channel samples. The resultant 8 channel samples are gated in a formatter with respective channel mute signals which, when asserted, effectively mute their corresponding channel samples.

BRIEF DESCRIPTION OF THE DRAWINGS

FIGS. 6A–6E are a Verilog code implementation of a volume control function in accordance with the present invention.

Like reference numerals refer to corresponding parts throughout the drawing figures.

DETAILED DESCRIPTION

Embodiments of the present invention are discussed below in the context of an interface 21 configured to process up to 8 channels of an audio image for simplicity only. It is to be understood that embodiments of the present invention are equally applicable to interfaces which process a greater number of channels, as well as to other suitable structures which process digital audio data. Accordingly, the present invention is not to be construed as limited to specific examples described herein but rather includes within its scope all embodiments defined by the appended claims.

Figure 1:
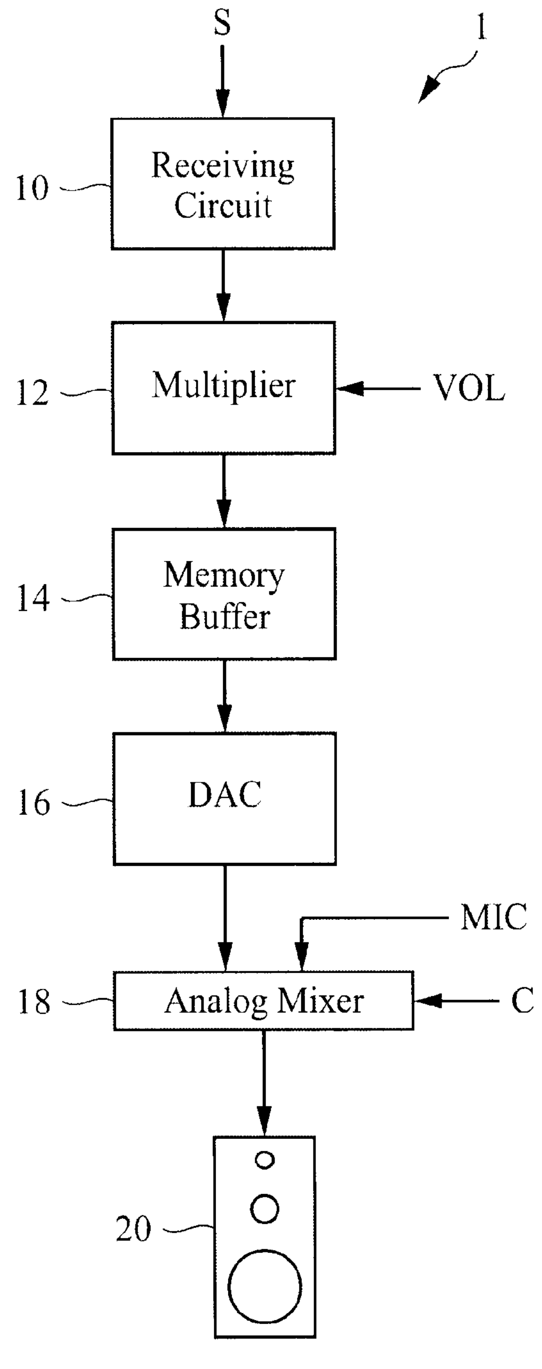
FIG. 1 (PRIOR ART)
FIG. 1 is a block diagram of a conventional audio interface.
Figure 2:
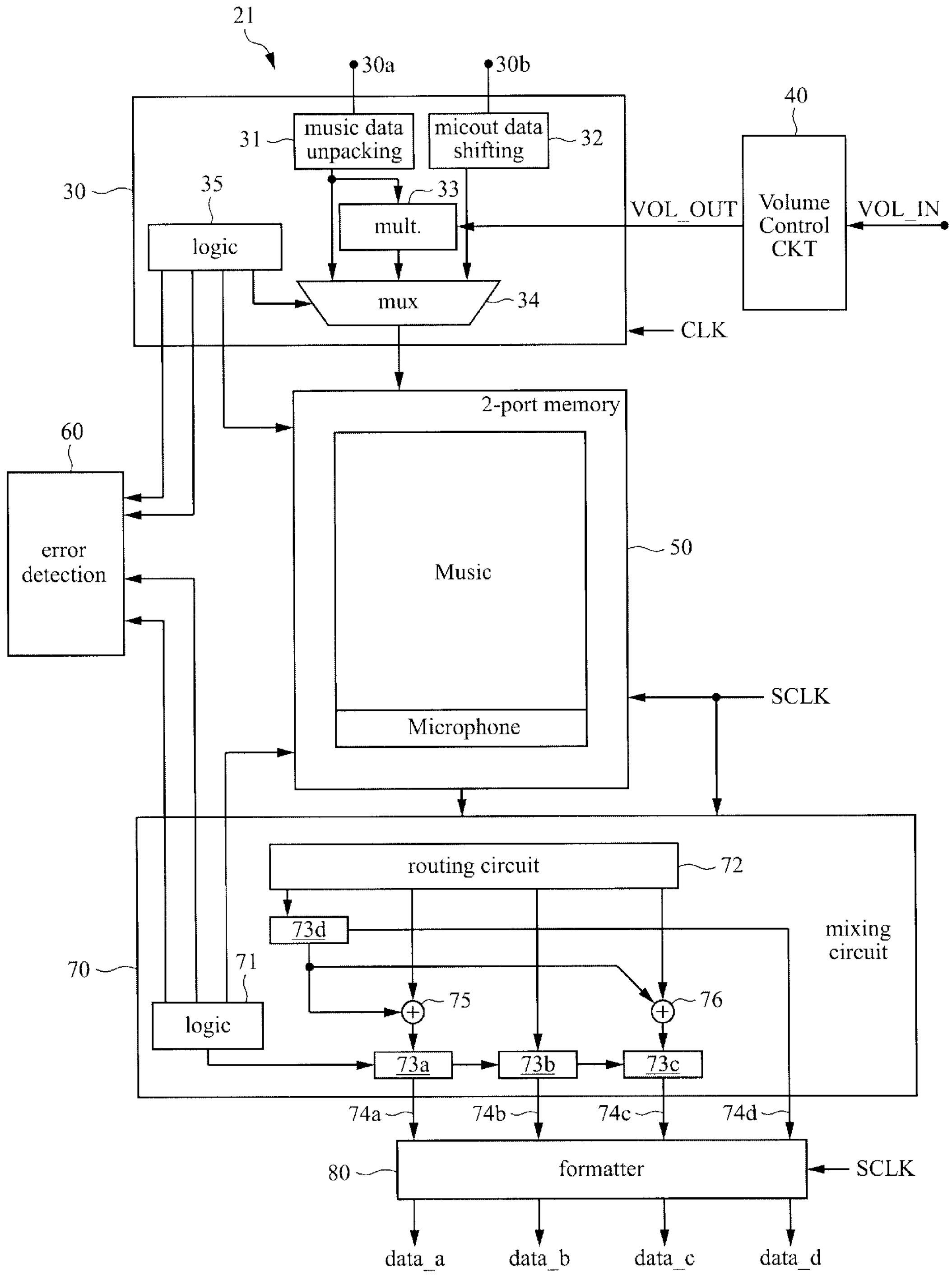
FIG. 2 is a block diagram of an audio interface in accordance with the present invention.

Referring to FIG. 2, the interface 21 includes a receiving circuit 30, a volume control circuit 40, a memory 50, an error detection circuit 60, a mixing circuit 70, and a formatter 80. The interface 21 includes first and second input terminals 30*a* and 30*b* for receiving first and second input signals, respectively. In one embodiment, the first input terminal 30*a* is coupled to receive a multi-channel, 24-bit resolution music signal MUSIC originating from, for instance, a DVD player and buffered by an associated DRAM (not shown for simplicity), and the second input terminal 30*b* is coupled to receive a microphone signal MICOUT provided by, for instance, a microphone or associated DRAM (not shown for simplicity). The music signal MUSIC and the microphone signal MICOUT are clocked into a music data unpacking unit 31 and a microphone data shifting circuit 32, respectively, using a system clock CLK of, for instance, 50 MHz. The music unpacking circuit 31 provides the music signal MUSIC as an input signal to a multiplier 33 and to a multiplier 34 in an MPEG2-compliant format. The multiplier 33 multiplies the music signal MUSIC and a volume control signal VOL__OUT to generate a volume-adjusted music signal MUSIC' which, in turn, is provided as a second input signal to the multiplier 34. The microphone data shifting circuit 32 formats the microphone signal MICOUT according to the MPEG2 standard and provides the microphone signal MICOUT as a third input signal to the multiplexer 34. The multiplexer 34 passes one of its input signals to an input data port of the memory 50 in response to a mode select signal M.

The mode select signal M is generated by a logic circuit 35 according to mode control signals provided by an associated control circuit (not shown for simplicity). The mode control signals inform the logic circuit 35, as well as the mixing circuit 70 and formatter 80, as to the presence and multiplexing format of the music signal MUSIC and microphone signal MICOUT. In some applications, the received music signal MUSIC is a 6-channel audio image such as, for instance, is used in a Dolby Digital Surround Sound system. Here, the 2 unused channels are available and may be used to simultaneously process a microphone signal MICOUT with the 6-channel music signal MUSIC. In other applications, the music signal MUSIC is an 8-channel audio image. Channel assignments are listed below in Table 1.

TABLE 1

| channel assignment | channel description |
|---|---|
| 0 | Left |
| 1 | Right |
| 2 | left surround |
| 3 | right surround |
| 4 | center |
| 5 | sub-woofer |
| 6 | left center/MICOUT |
| 7 | right center/MICOUT |

Typically, the memory 50 is a 2-port, 64 word×24 bit embedded SRAM which is partitioned into first and second partitions. Here, music samples are stored in memory locations within the first memory partition, and microphone samples are stored in memory locations within the second memory partition. The write addresses for the music and microphone samples are generated by the logic circuit 35 according to the mode control signals mentioned above. For example, in applications where the interface 21 receives a 6-channel music signal and a microphone signal, where continuous cycles of 6 music signal samples followed by a microphone signal sample are provided to the memory 50 by the multiplexer 34, the logic circuit 35 addresses the 6 music signal samples to the first memory partition, and then addresses the microphone signal sample to the second memory partition. Thus, while music data and microphone data are stored in separate memory partitions, they are nevertheless stored in a single memory.

In contrast, conventional audio interfaces use separate memories to store music and microphone samples. In such interfaces, music and microphone samples are read from their respective separate memories, and then combined in an external adder circuit. Using separate memories to store music and microphone samples requires duplicate circuitry such as, for instance, row and column decoders. Thus, by storing music and microphone samples in the same memory, present embodiments advantageously reduce silicon area and signal path complexity.

The mixing circuit 70 includes a logic circuit 71, a routing circuit 72, and four 24-bit registers 73*a*–73*d*. The logic circuit 71 generates the read addresses of music and microphone signal samples stored in respective partitions of the memory 50 in accordance with the above-described mode control signals. On each transition of a sample clock SCLK, the logic circuit 71 provides a read address to the memory 50 which, in response thereto, forwards the addressed, 24-bit signal sample to the routing circuit 72. In accordance with the mode control signals, the routing circuit 72 selectively forwards the signal samples to the registers 73*a*–73*d* in a successive manner. Once signal samples are loaded into all the registers 73*a*–73*d*, the registers 73*a*–73*d* simultaneously output their associated signal samples to the formatter 80 via associated signal lines 74*a*–74*d*. This process is repeated for the next transition of the sample clock SCLK, thereby outputting 2 channels on each of the lines 74*a*–74*d*. In one embodiment, channel 0 and 1 information is output via line 74*a*, channel 2 and 3 information is output via line 74*b*, channel 4 and 5 information is output via line 74*c*, and channel 6 and 7 information is output via line 74*d*, whereby even channels are transmitted when the sample clock SCLK is high, and odd channels are transmitted when the sample clock SCLK is low.

Figure 3:
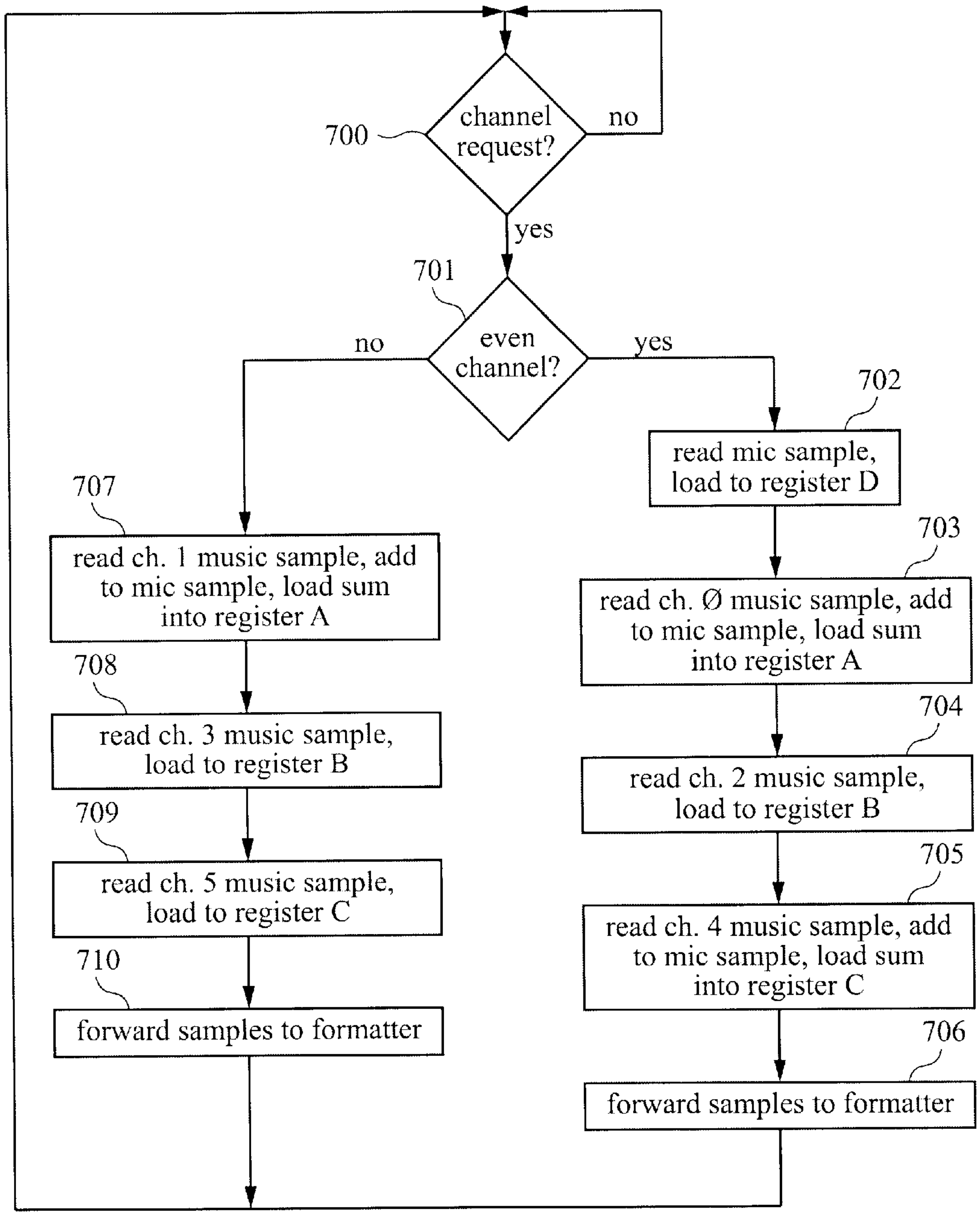
FIG. 3 is a flow chart illustrating operation of the mixing circuit of the interface of FIG. 2.

Operation of the mixing circuit 70 is perhaps better understood by way of example, wherein a 6-channel Dolby Digital music signal and a microphone signal are combined to implement a Karaoke system. Referring to FIGS. 2 and 3, the routing circuit 72 waits for a channel request signal from the logic circuit 71 and, if there is such a request (step 700), then determines whether the requested channel is even or odd (step 701). Assuming in this example that an even channel is requested first, the memory 50 reads a microphone signal sample to the routing circuit 72 which, in turn, forwards the microphone signal sample to register 73*d* (step 702). On the next read cycle, the memory 50 reads a music signal sample from channel 0 and, in response thereto, the routing circuit 72 forwards the channel 0 sample to an adder 75. The adder 75 adds the channel 0 sample and the microphone sample stored in register 73*d*, and provides the resultant sum to register 73*a* (step 703). On the next read cycle, a music signal sample from channel 2 is read from the memory 50, and thereafter loaded into register 73*b* (step 704). On the following read cycle, a music signal sample from channel 4 is read from the memory 50, and thereafter combined in an adder 76 with the microphone signal sample stored in register 73*d*. The resultant sum is loaded to register 73*c* (step 705). The samples stored in registers 73*a*–73*c* are then output to the formatter 80 via respective signal lines 74*a*–74*c* (step 706).

Assuming the next channel request is odd, as determined in step 701, the memory 50 reads a music signal sample from channel 1 to the routing circuit 71 which, in response thereto, forwards the channel 1 sample to the adder 75. The adder 75 adds the channel 1 sample and the microphone sample stored in register 73*d*, and provides the resultant sum to register 73*a* (step 707). On the next read cycle, a music signal sample from channel 3 is read from the memory 50, and thereafter loaded into register 73*b* (step 708). On the following read cycle, a music signal sample from channel 5 is read from the memory 50, and thereafter loaded to register 73*c* (step 709). The samples stored in registers 73*a*–73*c* are then output to the formatter 80 via respective signal lines 74*a*–74*c* (step 710). In this manner, a microphone signal is added to the left (0), right (1), and center (4) channels of a 6-channel Dolby Digital Surround Sound music signal. Here, note that if the microphone signal is not present, register 73*d* is forced to zero.

In applications where the received audio image is an 8-channel music signal or a 6-channel music signal without an associated microphone signal, register 73*d* is initially forced to zero at the beginning of the memory read sequence for each channel request, and then loaded as described above in an extra read cycle with the additional channel information. Here, during even channel requests, channel 6 samples are loaded into register 73*d* immediately after channel 4 samples are loaded into register 73*c* and, during odd channel requests, channel 7 samples are loaded into register 73*d* after channel 5 samples are loaded into register 73*c*. Thus, in such applications, the mixing circuit 70 outputs 8 channels to the formatter 80.

Figure 4:
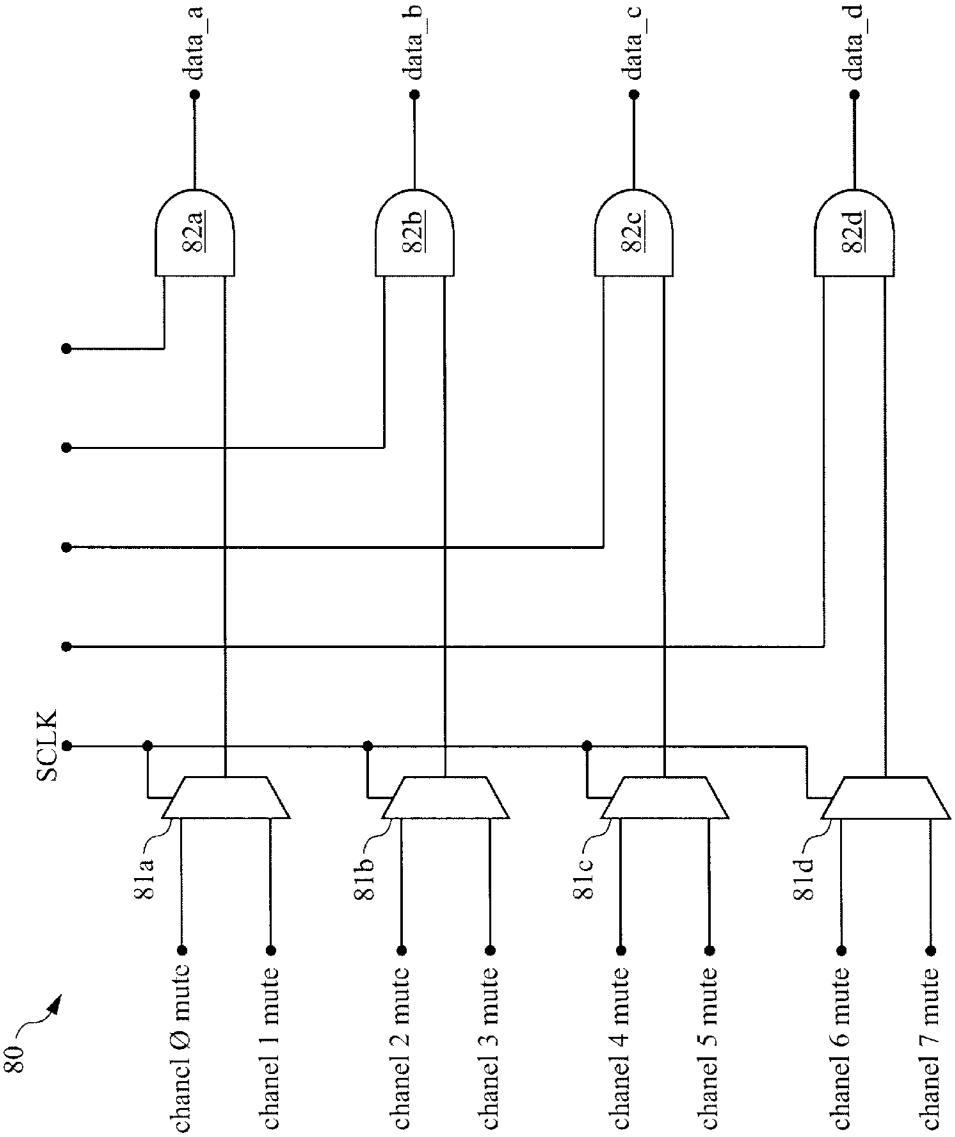
FIG. 4 is a schematic diagram of the formatter circuit in one embodiment of the interface of FIG. 2.

The formatter 80 includes four multiplexers 81*a*–81*d* each having two input terminals coupled to receive associated pairs of channel mute signals, as shown in FIG. 4. The sample clock SCLK is coupled to respective control terminals of the multiplexers 81*a*–81*d*. The output terminals of multiplexers 81*a*–81*d* are coupled to respective input terminals of associated 2-input NAND gates 82*a*–82*d*. The other input terminals of the multiplexers 81*a*–81*d* are coupled to respective signal lines 74*a*–74*d*. Thus, when the sample clock SCLK is high, multiplexers 81*a*–81*d* forward even channel mute signals to first input terminals of respective NAND gates 82*a*–82*d*, and the mixing circuit 70 forwards even channel samples to respective second input terminals of associated NAND gates 82*a*–82*d*. If a particular channel mute signal is logic high, the corresponding NAND gate 82 provides its input signal sample onto a corresponding output signal line data. If, on the other hand, the channel mute signal is logic low, the corresponding NAND gate 82 forces its output to zero, thereby effectively muting the associated audio channel. The logic states of the channel mute signals are user-selectable and are stored in a register (not shown for simplicity).

For example, where a user desires to turn off a surround sound feature, thereby desiring to hear only the left and right channels of an audio image, the mute signals for channels 0 and 1 are set to logic high, and the mute signals for channels 3–7 are set to zero. Thus, when the sample clock SCLK is high, the channel mute signals 0, 2, 4, and 6 are passed through respective multiplexers 81*a*–81*d* and thereafter gated with samples from the even channels, i.e., channels 0, 2, 4, and 6, in respective NAND gates 82*a*–82*d*. Here, the NAND gate 82*a* provides the associated channel 0 sample on signal line data_a, while the remaining NAND gates 82*b*–82*d* force their respective output signal lines data_b, data_c, and data_d to zero. In a similar manner, when the sample clock SCLK transitions to logic low, the NAND gate 82*a* provides a channel 1 sample to output signal line data_a, and NAND gates 82*b*–82*d* force their respective channel outputs to zero. In this manner, the formatter provides 8 time multiplexed channels onto four output lines. Here, unlike prior art techniques which mute channels by manipulating its associated data, e.g., by forcing the channel data to zero while stored in memory, present embodiments do not require any additional memory read cycles and associated logic circuitry, thereby reducing silicon area while optimizing performance.

Figure 5:
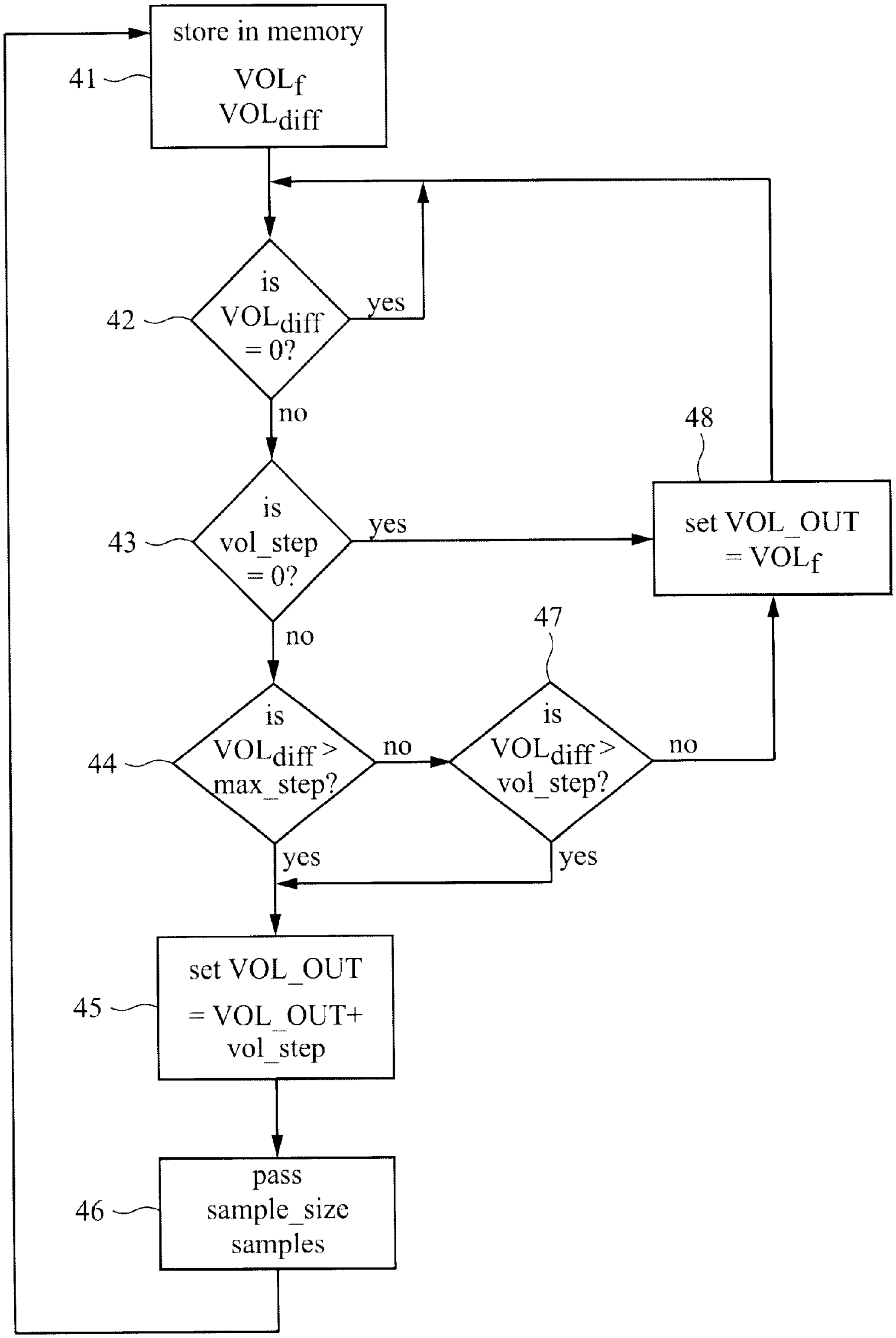
FIG. 5 is a flow chart illustrating operation of the volume control circuit in one embodiment of the interface of FIG. 2.

The present invention achieves other advantages over prior art audio interfaces. As mentioned above, present embodiments eliminate the popping noise caused during volume changes of an audio signal by gradually changing the signal volume level. Referring now to FIG. 5, the volume control circuit 40 is coupled to receive an input volume signal VOL_IN provided by a user via a suitable volume control device such as, for instance, a knob. When a change in the input volume control signal VOL_IN is detected, the volume control circuit 40 gradually changes the value of the output volume signal VOL_OUT in predetermined increment levels. As a result, the multiplier 33 gradually changes the output music signal MUSIC, and therefore gradually changes the audible volume level of the music signal in predetermined increment levels. In this manner, the present invention eliminates the popping noise mentioned above with respect to the prior art, thereby allowing for smooth transitions between signal volume levels. In one embodiment, the volume control signal VOL_OUT is a 10 bit signal, thereby providing $21^{10}$=1024 possible volume levels to the multiplier 33.

The specific response of the multiplier 33 to signal volume changes indicated by transitions in the input volume signal VOL_IN is dynamically controlled using 2-bit parameter values vol_step, max_step, and sample_size, where vol_step indicates the number of incremental volume steps per clock cycle, max_step indicates the maximum number of incremental volume changes between successive clock cycles, and sample_size indicates the number of audio samples for each channel which pass between incremental volume step changes. These parameter values are stored in a suitable buffer (not shown for simplicity) of the volume control circuit 40, and in some embodiments are user-selectable. For instance, where the parameter values for vol_step, max_step, and sample size are equal to 2, 4, and 2, respectively, the signal volume is increased from an initial value $VOL_i$ to a final value $VOL_f$ by increasing the volume signal 2 increments every 2 audio samples, where the maximum number of volume level increments per clock cycle is 4.

For example, referring to FIGS. 4 and 5, where the user desires to change the signal volume from an initial volume level $VOL_i$ to a final volume level $VOL_f$, the user adjusts the volume control knob (not shown) so that the input volume signal VOL_IN changes from the initial value $VOL_i$ to the final value $VOL_f$. The values $VOL_i$ and $VOL_f$, as well as a difference signal $VOL_{diff}=VOL_f-$VOL_OUT, are stored in suitable registers (step 41). If the difference $VOL_{diff}$ between the current output volume signal VOL_OUT and the final value $VOL_f$ is zero, i.e., the user did not change the volume level, the values $VOL_i$ and $VOL_f$ are again compared (step 42). If, on the other hand, there is a desired volume change, i.e., $VOL_{diff}\neq 0$, the parameter value vol_step is retrieved and compared to zero (step 43). If vol_step ≠0, then the value $VOL_{diff}$ is compared to the parameter value max_step (step 44). If the desired volume difference is greater than the maximum number of volume level increments allowed per clock cycle, i.e., if $VOL_{diff}$ is greater than max_step, the output volume signal VOL_OUT is set equal to the input volume signal plus the number of volume level increments desired per transition cycle, i.e., VOL_OUT=VOL_IN+vol_step (step 45). The current volume setting of signal VOL_OUT is maintained for a predetermined number of audio samples, as indicated by the parameter value sample_size (step 46). Processing continues in this manner until the output volume signal VOL_OUT equals the desired final volume level VOL_$_f$. Thus, the output volume level gradually transitions from an initial value to a final value at a rate determined by user-selectable parameter values.

If the difference between the output volume level and the final volume level is less than or equal to the maximum number of volume increments allowed per cycle, i.e., if $VOL_{diff}\ngtr$ max_step (step 44), and the difference $VOL_{diff}$ is less than or equal to the number of volume increments per cycle, i.e., if $VOL_{diff}\ngtr$ vol_step (step 47), the output volume VOL_OUT is set equal to the final volume level $VOL_f$, (step 46) If, on the other hand, $VOL_{diff}<$vol_step (step 47), then the output volume signal VOL_OUT is incremented according to the parameter value vol_step (step 45), maintained for the predetermined number of samples (step 46), and further processed as described above.

If it is desirable to effect an instantaneous volume change, the parameter vol_step is set equal to zero such that in response to the comparison step 43, the output volume signal VOL_OUT is set to equal to the desired final volume level $VOL_f$. Such operation may be desirable in certain applications, as required by the user. Typically, vol_step is set to either 2 or 4 which, in turn, call for 2 and 4 volume increment changes per clock cycle.

The above-described logic utilized by present embodiments to eliminate popping noise during volume signal transitions may be implemented in any suitable manner. In some embodiments, this volume control logic is performed by a suitable programmable gate array or ASIC, while in other embodiments this volume control logic is performed using dedicated logic circuitry. In still other embodiments, this volume control logic is implemented in software such as, for instance, using the Verilog® code shown in FIGS. 6A–6E, from which one skilled in the art may readily construct a suitable logic function.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention. In some embodiments, the sample clock has a frequency of 44.1 kHz, and the digital audio signal is a 24-bit resolution signal. In some embodiments, the memory is a 2-port embedded SRAM. In some embodiments, the memory is a 64 word by 24 bit non-volatile memory.

I claim:

1. An audio interface circuit for reducing noise when changing the audible volume level of a music signal, said interface comprising:

a multiplier having a first input terminal coupled to receive said music signal using a sample clock, a second input terminal coupled to receive an output volume control signal, said multiplier multiplying said music signal and said output volume control signal to produce a volume-adjusted music signal; and a volume control circuit having an input terminal coupled to receive an input volume control signal provided by a user of said interface and having an output terminal for providing said output volume control signal, said volume control circuit gradually changing said output volume control signal in response to changes in said input volume control according to a predetermined increment level, whereby said multiplier gradually increments said volume-adjusted music signal according to said predetermined increment levels in response to corresponding changes in said input volume control signal.

2. The interface of claim 1, wherein said input volume control signal comprises a 10-bit digital signal.

3. The interface of claim 2, wherein said multiplier comprises a 10-bit multiplier.

4. The interface of claim 2, wherein said output volume control signal is incremented, in response to changes in said input volume control signal, by said predetermined increment level on each cycle of said sample clock.

5. The interface of claim 2, wherein said output volume control signal is incremented, in response to changes in said input volume control signal, by said predetermined increment level every N cycles of said sample clock, wherein the value N is a predetermined parameter.

6. A method of reducing noise when changing the audible volume level of a digital music signal sampled using a sample clock, said method comprising the steps of:

receiving a digital input volume signal indicative of a volume setting desired by a user;

generating a digital output volume control signal in response to said input volume control signal;

gradually incrementing a binary value of said output volume control signal by a predetermined increment level per sample clock cycle in response to changes in a binary value of said input volume control signal; and multiplying the binary values of said output volume control signal and said music signal using a multiplier to produce a volume-adjusted music signal.

7. The method of claim 6, wherein said multiplier comprises a 10-bit multiplier.

8. The method of claim 6, wherein said incrementing step further comprises:

subtracting an initial value of said input volume control signal from a final value of said input volume control signal to generate a difference value;

if said difference value is positive, decreasing the binary value of said output volume control signal by said predetermined increment level on each clock cycle until the binary value of said output volume control signal equals the binary value of said input volume control signal; and if said difference value is negative, increasing the binary value of said output volume control signal by said predetermined increment level on each clock cycle until the binary value of said output volume control signal equals the binary value of said input volume control signal.

9. The method of claim 8, wherein said predetermined increment level is user-selectable.

* * * * *